United States Patent [19]
Yamano et al.

[11] Patent Number: 5,535,018
[45] Date of Patent: Jul. 9, 1996

[54] INFORMATION PROCESSING APPARATUS

[75] Inventors: Akihiko Yamano, Sagamihara; Katsunori Hatanaka, Yokohama; Kunihiro Sakai, Isehara; Takahiro Oguchi, Ebina; Shunichi Shido, Sagamihara, all of Japan

[73] Assignee: Canon Kabushiki Kaisha, Tokyo, Japan

[21] Appl. No.: 565,013

[22] Filed: Nov. 30, 1995

Related U.S. Application Data

[63] Continuation of Ser. No. 961,385, Oct. 15, 1992, abandoned.

[30] Foreign Application Priority Data

Oct. 15, 1991 [JP] Japan ...................... 3-293906

[51] Int. Cl.$^6$ .......................................... H04N 1/40
[52] U.S. Cl. .......................... 358/444; 358/451; 358/426; 382/298; 382/299; 395/128
[58] Field of Search ...................... 358/426, 432, 358/433, 400, 403, 406, 261.1–261.3, 444, 404, 448, 456; 395/102, 128; 382/298–301, 254, 258

[56] References Cited

U.S. PATENT DOCUMENTS 4,558,436  12/1985  Wagensonner et al. ................ 365/230
5,062,136  10/1991  Gattis et al. ............................. 358/426
5,148,497   9/1992  Pentland et al. ......................... 382/47

FOREIGN PATENT DOCUMENTS 0078441   5/1983  European Pat. Off. ......... H04N 5/76
0323849   7/1989  European Pat. Off. ....... H04N 1/216
0439144   7/1991  European Pat. Off. ......... H04N 1/21
3153161   7/1991  Japan .............................. H04N 1/21
2199982   7/1988  United Kingdom ............ G11B 23/18
2213345   9/1989  United Kingdom .......... H04N 1/393
2231463  11/1990  United Kingdom ............ H04N 5/92

Primary Examiner—Scott A. Rogers
Assistant Examiner—Jerome Grant, II
Attorney, Agent, or Firm—Fitzpatrick, Cella, Harper & Scinto

[57] ABSTRACT

An information processing apparatus for accumulating image information consisting of n pixels and effecting the processing of output of the information is provided with a plurality of memory devices, a distributing device and an output control device. The information is stored in the plurality of memory devices. By the distributing device, the image information consisting of the n pixels are divided into m pixel unit basis (n>m), and the information consisting of the m pixels into a p (m>p) pixel unit basis, and the plurality of information each consisting of the p pixels are distributed to the plurality of memory devices. Upon the output of the image information, the information stored in the plurality of memory devices are selectively outputted by the output control device.

3 Claims, 7 Drawing Sheets

FIG. 3

| $a_{00}$ | $b_{00}$ | $a_{01}$ | $b_{01}$ | $a_{02}$ | $b_{02}$ | — — — | $a_{0n-1}$ | $b_{0n-1}$ | $a_{0n}$ | $b_{0n}$ |
|---|---|---|---|---|---|---|---|---|---|---|
| $c_{00}$ | $d_{00}$ | $c_{01}$ | $d_{01}$ | $c_{02}$ | $d_{02}$ | | $c_{0n-1}$ | $d_{0n-1}$ | $c_{0n}$ | $d_{0n}$ |
| $a_{10}$ | $b_{10}$ | | | | | | | | | |
| $c_{10}$ | $d_{10}$ | | | | | | | | | |
| $a_{n0}$ | $b_{n0}$ | | | | | | | | | |
| $c_{n0}$ | $d_{n0}$ | | | | | | | | | |

FIG. 4

| $a_{00}$ | $a_{01}$ | — — — — — — — — — — — — — — — | $a_{0n}$ |
|---|---|---|---|
| $a_{10}$ | $a_{11}$ | — — — — — — — — — — — — — — — | $a_{1n}$ |
| | | | |
| $a_{n0}$ | $a_{n1}$ | | $a_{nn}$ |

FIG. 5

| $a_{00}$ | $b_{00}$ | $a_{01}$ | $b_{01}$ | ------------------------------- | $a_{0n}$ | $b_{0n}$ |
|---|---|---|---|---|---|---|
| $a_{10}$ | $b_{10}$ | $a_{11}$ | $b_{11}$ | ------------------------------- | $a_{1n}$ | $b_{1n}$ |
| ⋮ | ⋮ | | | | | |
| $a_{n0}$ | $b_{n0}$ | | | | $a_{nn}$ | $b_{nn}$ |

FIG. 6

| $a_{00}$ | $a_{01}$ | ---------- | $a_{0n}$ |
|---|---|---|---|
| $c_{00}$ | $c_{01}$ | ---------- | $c_{0n}$ |
| ⋮ | ⋮ | | |
| $a_{n0}$ | $a_{n1}$ | | $a_{nn}$ |
| $c_{n0}$ | $c_{n1}$ | | $c_{nn}$ |

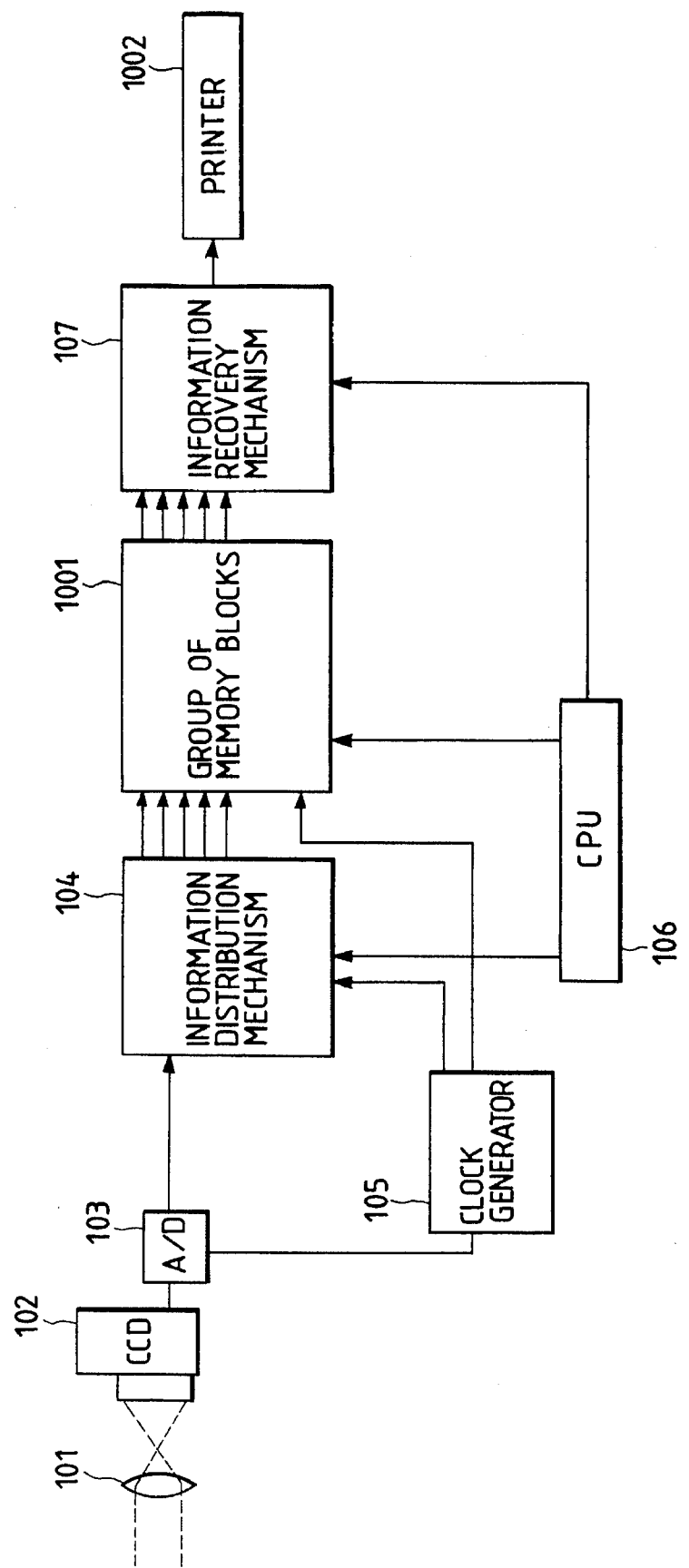

INFORMATION PROCESSING APPARATUS

This application is a continuation of application Ser. No. 07/961,385 filed Oct. 15, 1992, now abandoned.

BACKGROUND OF THE INVENTION

1. Field of the Invention

The invention relates to an information processing apparatus using a technique of a scanning tunnel microscope or the like.

2. Related Background Art

In recent years, memory materials are mainly used in the electronics industries such as computer, its peripheral apparatuses, video disc, digital audio disc, and the like. The development of the memory materials is also actively progressing. Although the performances which are required for such memory materials are different depending on the application, it is indispensable that a response speed for recording and reproducing is high.

Hitherto, a semiconductor memory or a magnetic memory which is made of a material such as magnetic material or semiconductor is a main stream. However, in association with the development of the recent laser technique, a cheap recording medium of high density by an optical memory using an organic thin film such as organic pigment, photo polymer, or the like has been put into practical use.

On the other hand, in recent years, a scanning tunnel microscope (hereinafter, abbreviated to STM) which can directly observe an electron structure of a surface atom of a conductor has been developed (G. Binnig, et al., Phys. Rev. Lett, 49, 57, 1982). A real spatial image can be measured at a high resolution irrespective of a difference between a monocrystal and an amorphous material. Moreover, there is also an advantage such that the image can be measured with low electric power without damaging a sample by a current. Further, the STM can operate even in the atmosphere and can be used for various materials. Therefore, applications of a wide range are expected.

The STM uses a principle such that when a voltage is applied between a metal probe (probe electrode) and a conductive material and the probe is allowed to approach up to a distance of about 1 nm, a tunnel current flows. The tunnel current is very sensitive because it exponentially responds to a change in distance between the probe and the conductive material. By scanning the probe so as to keep the tunnel current constant, various information regarding the whole electron cloud in the real space can be also read. In this instance, a resolution in the in-plane direction is equal to about 0.1 nm.

Therefore, by applying the principle of the STM, high density recording and reproduction can be executed with a resolution on the order of atom (subnanometer). For instance, according to an information processing apparatus disclosed in JP-A-61-80536, atomic particles adsorbed on the medium surface are removed by an electron beam or the like and data is written and the written data is reproduced by the STM.

There has also been proposed a method of performing the recording and reproduction by the STM by using a thin film as a recording layer which is made of a material having a memory effect to switch characteristics of a voltage/current, for instance, an organic compound or chalcogen compound class having a conjugate $\pi$ electron system (JP-A-63-161552, JP-A-63-161553). According to the above method, by setting a pit size for recording to 10 nm, the recording and reproduction of a large capacity of $10^{12}$ bits/cm$^2$ can be performed.

As a scanning mechanism of the probe electrode, there is a cantilever type (JP-A-62-281138). It is possible to form several tens of cantilever type mechanisms each of which is made of SiO$_2$ and has dimensions such that a length is equal to 100 µm, a width lies within a range from 10 to 20 µm, and a thickness is equal to 0.5 µm onto an Si substrate. A writing/reading circuit is also integrated on the same substrate.

Generally, in the case of recording and reproducing image information at a high quality, a searching operation such as to pick up an arbitrary one of a plurality of images is required. In case of information such as a still image file in which there is no correlation among the images, such a searching operation is particularly required. Actually, operations such that a plurality of images are simultaneously generated on a display such as a monitor or the like and the operator selects a desired image or the like are executed as such a searching operation. In this case, since an information amount per picture plane is very large, all of the pixels are not generated but they are thinned out and displayed in accordance with the resolution of the monitor. In case of generating the pixels for an apparatus such as monitor, printer, or the like having different display resolutions, the operations such that the pixels are also thinned out and the like are executed and the resultant image data is generated.

Hitherto, however, an image of a low resolution is formed from an original image by software processes. Consequently, it takes a time to form an image of a necessary resolution and output time increases.

SUMMARY OF THE INVENTION

It is an object of the invention to provide an information processing apparatus which can accomplish the reduction (high processing speed) of processing time upon generation of image information.

The above object is accomplished by an information processing apparatus for accumulating and generating image information consisting of n pixels, comprising: a plurality of memory means for accumulating information; distributing means for dividing the image information consisting of the n pixels into m (n>m) pixel units, for further dividing the information consisting of the m pixels into p (n>p) pixel units, and for distributing the plurality of divided information each consisting of the p pixels into the plurality of memory means, respectively; and output control means for selectively generating the information accumulated in the plurality of memory means in accordance with a resolution that is necessary upon generation of the image information.

According to such an apparatus, the image information supplied is distributed by the distributing means so as to obtain the image in which the original image is thinned out into 1/(the number of memory blocks) when it is seen on a memory block unit basis. When the image information is outputted, only the memory blocks according to the necessary resolution among the outputs of the memory blocks are accessed and the signals of the accessed memory blocks are outputted.

The above and other objects and features of the present invention will become apparent from the following detailed description and the appended claims with reference to the accompanying drawings.

BRIEF DESCRIPTION OF THE DRAWINGS

FIG. 3 is a diagram showing pixels of an original image according to the first embodiment;

FIG. 4 is a diagram showing the pixels of the image of ¼ of the original image according to the first embodiment;

FIG. 5 is a diagram showing the pixels of the image of ½ in the vertical direction of the original image according to the first embodiment;

FIG. 6 is a diagram showing the pixels of ½ in the lateral direction of the original image according to the first embodiment;

FIG. 10 is a whole constructional diagram of the second embodiment according to the invention.

DETAILED DESCRIPTION OF THE PREFERRED EMBODIMENTS

The invention will be practically explained hereinbelow with respect to embodiments.
(first embodiment)

Figure 1:
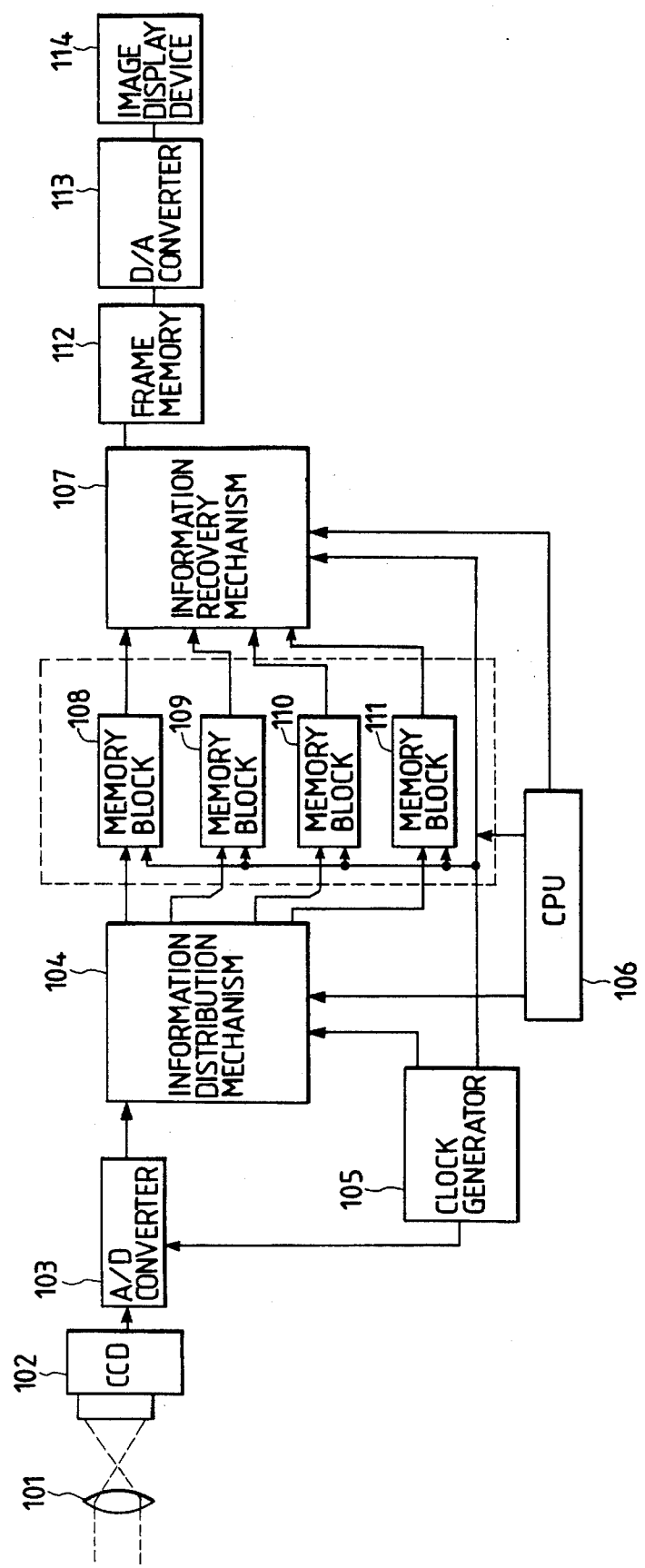
FIG. 1 is a whole constructional diagram of the first embodiment according to the invention.

There is shown an embodiment in the case where an information processing apparatus of the invention is applied to a still video camera. FIG. 1 is a constructional diagram of the embodiment. In FIG. 1, reference numeral 101 denotes a lens; 102 a CCD; 103 an A/D converter; 104 an information distributing mechanism (distributing means); 105 a clock generator; 106 a CPU; 107 an information recovery mechanism (output control means); 108, 109, 110, and 111 memory blocks; 112 a frame memory; 113 a D/A converter; and 114 an image display device.

According to the above construction, image information (the total number of pixels of the image information is determined by the effective pixels of the CCD) whose image has been formed onto the CCD (pixels of the effective pixels) 102 by the lens 101 is converted into a digital signal by the A/D converter 103. An output of the A/D converter 103 is divided by the information distributing mechanism 104 on an m (n>m) pixel unit basis, for instance, a pixel unit basis of 2×2 pixels. Further, the m pixels are divided on a p (m>p) pixel unit basis, for instance, one pixel unit basis. Each of the p pixels among the m pixels is distributed to m/p memory blocks 108 to 111, respectively. Inputs of the memory blocks are controlled synchronously with the clocks obtained by frequency dividing an output frequency of the A/D converter 103 that is controlled by the clock generator 105 into ¼.

It is now assumed that m=2×2=4 and p=1 for simplicity of explanation.

That is, the elements $a_{xx}$, $b_{xx}$, $c_{xx}$, and $d_{xx}$ of (2×2) pixels of the original image in FIG. 3 are recorded into the respective memory blocks as image information in a format similar to that of the image consisting of only the element $a_{xx}$ shown in FIG. 4 which has been distributed.

It is now assumed that an element $a_{xx}$ has been recorded into the memory block 108, an element $b_{xx}$ has been recorded in the memory block 109, an element $c_{xx}$ has been recorded in the memory block 110, and an element $d_{xx}$ has been recorded in the memory block 111. When the image is reproduced, although outputs of the memory blocks are controlled by similar clocks, an input channel of the information recovery mechanism 107 is selectively controlled by the CPU 106 in accordance with an image with a required resolution. Therefore, the image of ½ in the vertical direction as shown in FIG. 5 can be easily formed from the output image information of the memory blocks 108 and 109. The image of ½ in the lateral direction as shown in FIG. 6 can be easily formed from the output image information of the memory blocks 108 and 110.

Since one memory block solely has the image information as shown in Pig. 4, in the case where addresses which are designated in the memory blocks are deviated by a few frames and the image information of different frames are respectively generated from the frames, by writing the image information into the addresses in the frame memory 112 by the information recovery mechanism 107 in FIG. 1 in a manner such that four images are displayed like a matrix onto the image display device 114, four images can be simultaneously displayed.

The image information that is finally generated is accumulated into the frame memory 112 and is converted into the analog information by the D/A converter 113 and outputted in accordance with a sync frequency of the image display device 114.

Figure 2:
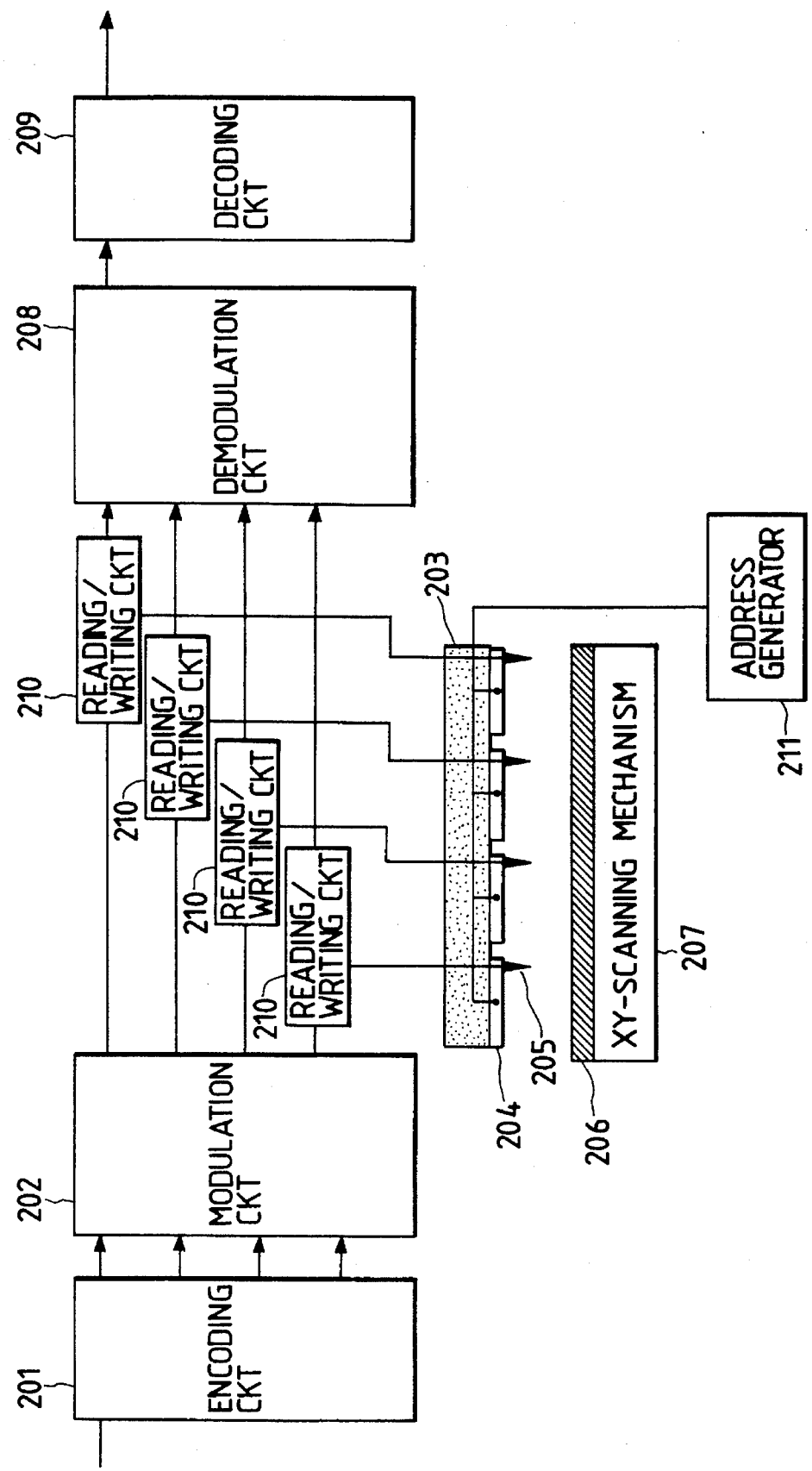
FIG. 2 is a constructional diagram of a memory block shown in FIG. 1.

The recording and reproducing operations in the memory block will now be described with reference to FIG. 2 showing a constructional diagram of the memory block. In FIG. 2, reference numeral 201 denotes an encoding circuit; 202 a modulation circuit; 203 a substrate; 204 a cantilever type scanning mechanism; 205 a probe electrode; 206 a recording medium; 207 an XY scanning mechanism; 208 a demodulation circuit; 209 a decoding circuit; 210 a reading/writing circuit; and 211 an address generator. Four reading/writing circuits 210 and the cantilever type scanning mechanism are formed on the same substrate 203.

In the embodiment, since the operation of the information and the control of the mechanism are executed in the same manner for each memory block, one memory block will be explained. First, the input information is BCH encoded by the encoding circuit 201 for error correction. Subsequently, an RZ modulation is executed by the modulation circuit 202. The modulated data is recorded onto the recording medium 206 by the probe electrode 205 which has been moved to the position according to an output write address of the address generator 211 by the XY scanning mechanism 207.

In the reproducing mode, the recorded information is read out by the probe electrode which has been moved by the XY scanning mechanism 207 to the position according to the output read address of the address generator 211 (In this instance, the information is read out by detecting a change in tunnel current flowing in the probe electrode). The read-out data is demodulated by the demodulation circuit 208 and is decoded by the decoding circuit 209 and is outputted.

Figure 7:
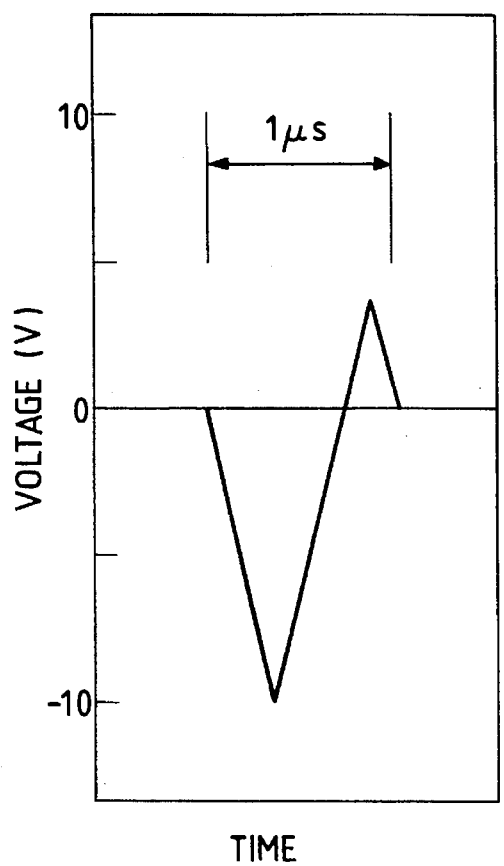
FIG. 7 shows a waveform of a pulse for writing in the recording mode in the first embodiment.
Figure 8:
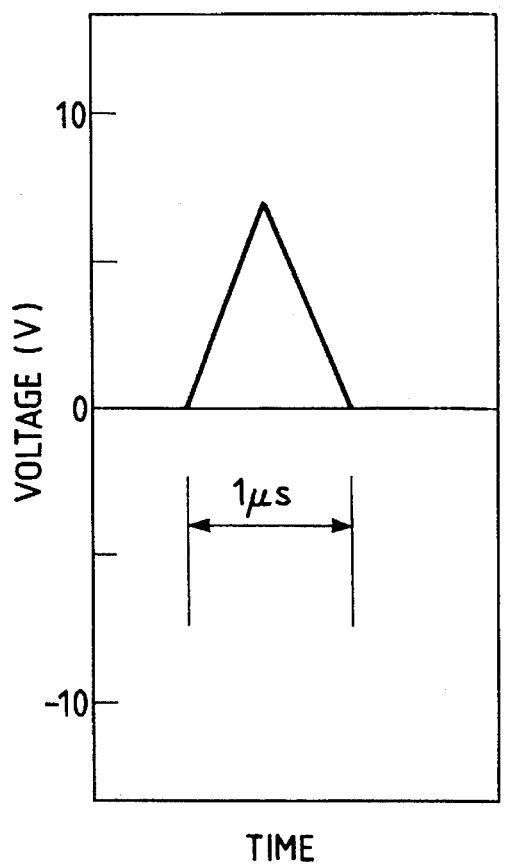
FIG. 8 shows a waveform of a pulse for erasing in the recording mode in the first embodiment.

Actually, the recording medium 206 is manufactured as follows. That is, Au is epitaxially grown on a smooth substrate obtained by cleaving mica. Eight layers of squalillium-bis-6-octylazulene (hereinafter, abbreviated to SOAZ) having an electric memory effect are laminated on the Au substrate by a Langmuir-Blodgett (LB) method, thereby forming a recording layer as a recording medium 206. The recording medium 206 is constructed by the substrate and an underelectrode layer (not shown). Since the recording layer is made of a material having the memory effect for the switching characteristics of a voltage/current, in the recording mode, it is sufficient to apply a pulse voltage of a waveform as shown in FIG. 7 between the probe electrode and the recording medium. In the erasing mode, it is sufficient to apply a pulse voltage of a waveform as shown in FIG. 8. In the reproducing mode, a voltage of about 100 mV such that the memory state of the recording layer doesn't change is applied and "1" or "0" is judged by a difference of a conductivity of the recording layer at that time.

Figure 9:
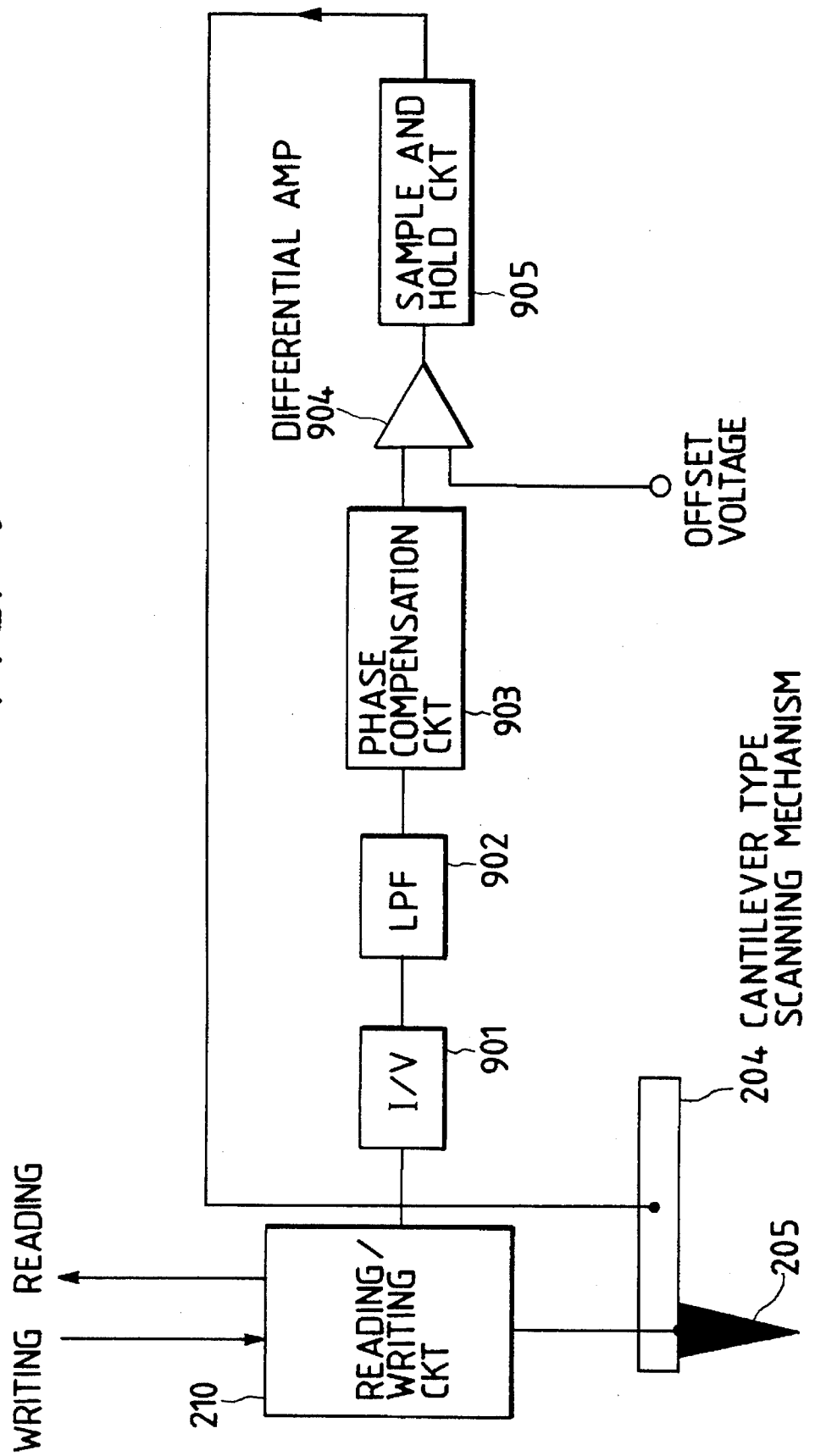
FIG. 9 is a block diagram showing a control circuit of the distance between a probe electrode and a recording medium in the first embodiment.

The distance between the recording medium and the probe electrode is controlled as follows by using a control circuit of FIG. 9. Generally, a bias voltage of about 100 mV is applied between the recording medium and the probe electrode. The probe electrode is allowed to approach the recording medium by the cantilever type scanning mechanism 204 until a state in which a current of about 2 nA flows. The current detected by the probe electrode 205 is converted into the voltage signal by an I/V converting circuit 901. The signal passes through an LPF 902 whose cut-off frequency is set to about a scanning frequency so that the probe electrode can trace only the component of frequencies which are equal to or lower than the frequency upon scanning of the detection current signal due to an inclination on the substrate or the like. The signal is transmitted through a phase compensation circuit 903 and a difference between an output voltage of the phase compensation circuit 903 and an offset voltage is calculated by a differential amplifier 904 so that the distance between the probe electrode and the recording medium is set to a constant value as an average. The signal which has been transmitted through the above circuit is used to control the cantilever type scanning mechanism 204, thereby performing a feedback control.

In the recording mode, the distance between the probe electrode and the recording medium is set to a constant value. A sample and hold circuit 905 is set into a holding state by the feedback control so as not to cause a collision between them.

Although the BCH encoding and the RZ modulating method have been used in the embodiment, the invention is not limited to them but other various methods which are generally used can be used.

(Second embodiment)

There is shown an embodiment in which the information processing apparatus of the invention is applied to a still video camera and an outputting speed to a printer is raised. FIG. 10 is a constructional diagram of the second embodiment. In FIG. 10, reference numeral 101 denotes the lens; 102 the CCD; 103 the A/D converter; 104 the information distributing mechanism; 105 the clock generator; 106 the CPU; 107 the information recovery mechanism; 1001 a group of memory blocks consisting of 25 memory blocks; and 1002 a printer.

According to the above construction, image information consisting of (2000×1125) pixels whose image has been formed on the CCD 102 by the lens 101 is converted into the digital signal by the A/D converter 103. An output of the A/D converter 103 is supplied to the information distributing mechanism 104, by which one information in (5×5) pixels is distributed into 25 memory blocks, respectively. The inputs of the memory blocks are controlled synchronously with clocks obtained by frequency dividing the output frequency of the A/D converter 103 that is controlled by the clock generator 105 into ⅕.

In the printing mode, although the outputs of the memory blocks are controlled by similar clocks, in the information recovery mechanism 107, the input of one of the input channels is permitted by the CPU 106 in case of a single print. From the data of the permitted input channel, the information recovery mechanism 107 outputs the image information and can print at a high speed. By making the output images of the memory blocks different, a plurality of images can be continuously outputted at a high speed.

In the embodiment, since the original image is distributed into ⅕ in each of the vertical and lateral directions, it is optimum to a printer having a resolution of about 400 d.p.i.. If the outputs of all of the channels are set to the outputs of the same frame, they can be outputted to a printer of a high precision or a conventional method whereby a resolution is reduced by executing processes in a software manner can be also used. The operations in the memory block are similar to those in the first embodiment.

What is claimed is:

1. An information processing apparatus for storing and outputting a plurality of image information each consisting of $n_1 \times n_2$ pixels, comprising:

a plurality of memory means each of which is adapted to independently store the information and output the stored information, each of the plurality of memory means including a probe and a recording medium arranged to face said probe;

distributing means for dividing each image information consisting of the $n_1 \times n_2$ pixels into a plurality of image information each consisting of an $m_1 \times m_2$ ($n_1 \times n_2 > m_1 \times m_2$, $m_1 \geq 2$, $m_2 \geq 2$) pixels unit, for further dividing each image information consisting of the $m_1 \times m_2$ pixels into a p ($m_1 \times m_2 > p$) pixel unit, and for distributing the plurality of divided information each consisting of the p pixels to said plurality of memory means which are respectively assigned beforehand, wherein each of said plurality of memory means stores a plurality of image information each of which consists of the distributed p pixels and the resolution of which is lower than that of the image information consisting of the $n_1 \times n_2$ pixels; and collecting means for selectively collecting the information stored in said plurality of memory means in accordance with a required resolution upon output of the image information and for outputting the collected information.

2. An apparatus according to claim 1, wherein said memory means includes an information recording and reproducing apparatus using a principle of an STM.

3. An information processing apparatus for storing and outputting a plurality of image information each consisting of $n_1 \times n_2$ pixels, comprising:

a plurality of memory means each of which is adapted to independently store the information and output the stored information;

distributing means for dividing each image information consisting of the $n_1 \times n_2$ pixels into a plurality of image information each consisting of an $m_1 \times m_2$ ($n_1 \times n_2 > m_1 \times m_2$, $m_1 \geq 2$, $m_2 \geq 2$) pixel unit, for further dividing each image information consisting of the $m_1 \times m_2$ pixels into a p ($m_1 \times m_2 > p$) pixel unit, and for distributing the plurality of divided information each consisting of the p pixels to said plurality of memory means which are respectively assigned beforehand, wherein each of said plurality of memory means stores a plurality of image information each of which consists of the distributed p pixels and the resolution of which is lower than that of the image information consisting of the $n_1 \times n_2$ pixels; and collecting means for selectively collecting the information stored in said plurality of memory means in accordance with a required resolution upon output of the image information and for outputting the collected information.

* * * * *

UNITED STATES PATENT AND TRADEMARK OFFICE
CERTIFICATE OF CORRECTION

PATENT NO. : 5,535,018

DATED : July 9, 1996

INVENTOR(S): AKIHIKO YAMANO ET AL.   Page 1 of 3

It is certified that error appears in the above-identified patent and that said Letters Patent is hereby corrected as shown below:

ON THE TITLE PAGE:

ITEM [56] REFERENCES CITED

U.S. PATENT DOCUMENTS, Insert:
      --5,107,112  4/92  Yanagisawa et al.
        5,128,533  7/92  Oguchi
        5,132,533  7/92  Kawase et al.
        5,149,989  9/92  Oguchi et al.
        5,150,035  9/92  Nose et al.
        5,170,238  12/92  Sakai et al.
        5,220,555  6/93  Yanagisawa et al.--

FOREIGN PATENT DOCUMENTS, Insert:
      --61 80536  4/1986  Japan
        62 281138  12/1987  Japan
        63 161552  7/1988  Japan
        63 161553  7/1988  Japan.--

Insert:
   --OTHER PUBLICATIONS
      G. Binnig et al., "Scanning tunnelling microscopy",
        49, 57 (1982)
      Helvetica Physica Acta. Vol. 55 pp. 726-735--

[57] ABSTRACT

Line 9, "are" should read --is--.
   Line 12, "each" should be deleted and "are" should
      read --is--.

UNITED STATES PATENT AND TRADEMARK OFFICE
CERTIFICATE OF CORRECTION

PATENT NO. : 5,535,018
DATED : July 9, 1996
INVENTOR(S) : AKIHIKO YAMANO ET AL.

It is certified that error appears in the above-identified patent and that said Letters Patent is hereby corrected as shown below:

COLUMN 1

Line 24, "semiconductor is a main stream" should read
    --a semiconductor has been the mainstream--.
Line 25, "the" (second occurrence) should be deleted and
    "cheap" should read --inexpensive--.
Line 26, "recording medium of high density by an optical
    memory" should read --high density optical memory
    recording medium--.
Line 55, "of" should read --of an--.

COLUMN 2

Line 25, "as" should read --as a--.
Line 31, "a" (first occurrence) should be deleted.

COLUMN 4

Line 17, "Pig. 4," should read --FIG. 4,--.

COLUMN 5

Line 44, "but" should read --and--.
Line 45, "used can be used." should read --known may
    be employed.

UNITED STATES PATENT AND TRADEMARK OFFICE
CERTIFICATE OF CORRECTION

PATENT NO. : 5,535,018

DATED : July 9, 1996

INVENTOR(S) : AKIHIKO YAMANO ET AL.

Page 3 of 3

It is certified that error appears in the above-identified patent and that said Letters Patent is hereby corrected as shown below:

<u>COLUMN 6</u>

Line 31, "pixels" should read --pixel--.

Signed and Sealed this

Thirteenth Day of May, 1997

Attest:

BRUCE LEHMAN

*Attesting Officer*     Commissioner of Patents and Trademarks